United States Patent [19]
Olsen et al.

[11] Patent Number: 4,575,675
[45] Date of Patent: Mar. 11, 1986

[54] TESTER FOR PULSED IMPATT DIODE AND METHOD OF OPERATING SAME

[75] Inventors: Lawrence H. Olsen, Hudson, N.H.; Donald S. Porterfield, Billerica, Mass.

[73] Assignee: Raytheon Company, Lexington, Mass.

[21] Appl. No.: 621,984

[22] Filed: Jun. 18, 1984

[51] Int. Cl.[4] ............................................. G01R 31/26
[52] U.S. Cl. ............................... 324/158 D; 324/57 R; 324/58 B
[58] Field of Search ................. 324/158 D, 57 R, 58 B

[56] References Cited
U.S. PATENT DOCUMENTS
3,904,962  9/1975  Olson, Jr. ..................... 324/158 D FOREIGN PATENT DOCUMENTS
0044573  4/1977  Japan ............................. 324/158 D
0033184  3/1978  Japan ............................. 324/158 D Primary Examiner—Stanley T. Krawczewicz
Attorney, Agent, or Firm—Philip J. McFarland; Richard M. Sharkansky

[57] ABSTRACT

A method of testing the impedance of an IMPATT diode operating as a pulsed oscillator at a predetermined pulse repetition frequency is shown to comprise the steps of alternately applying through different, but known, paths, a test signal to the bias line to such diode and observing the change in the test signal as reflected from the IMPATT diode.

4 Claims, 1 Drawing Figure

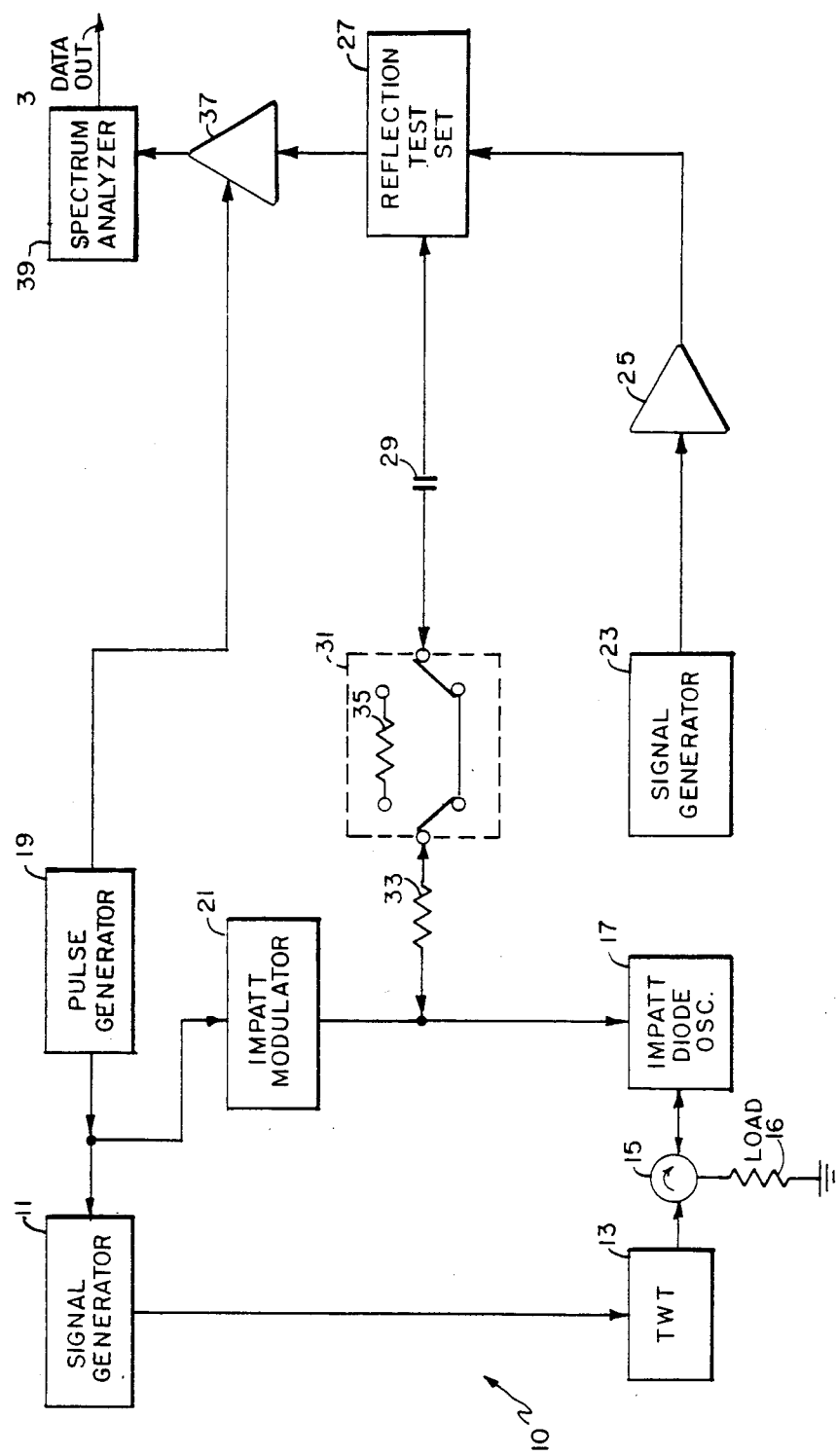

TESTER FOR PULSED IMPATT DIODE AND METHOD OF OPERATING SAME

BACKGROUND OF THE INVENTION

This invention pertains generally to test equipment for IMPATT diode modulators and in particular to a technique for measuring, under pulsed operating conditions, the bias port impedance of an IMPATT diode.

As is known, IMPATT diodes utilized in pulsed solid state microwave sources require high power modulators designed typically to supply around two amperes of peak current to each IMPATT diode. Because of the unknown characteristics of the IMPATT diode circuit under different operating conditions, i.e. pulse width or duty cycle, current modulator designs have generally evolved through empirical methods. Thus, due to the lack of accurate bias circuit pulsed impedance data, gross characteristics of a particular type of diode are assumed and the modulator designs developed accordingly. Obviously, if the characteristics of a selected type of IMPATT diode over a frequency band of interest and under pulsed operating conditions were known, the design of the modulator would be greatly simplified.

SUMMARY OF THE INVENTION

With the foregoing background of the invention in mind, it is therefore a primary object of this invention to provide a technique for measuring the impedance characteristics of IMPATT diodes under different operating conditions and over a frequency band of interest.

The foregoing and other objects of this invention are generally attained by providing a measurement technique wherein a measurement is made under any operating condition of the change caused by insertion of a known impedance element in circuit with an IMPATT diode. Specifically, the reflection coefficient of a test circuit with and without the known impedance is determined under any operating condition, thereby allowing the impedance of the IMPATT diode to be determined.

BRIEF DESCRIPTION OF THE DRAWING

For a more complete understanding of this invention, reference is now made to the drawing in which the single FIGURE is a block diagram of a pulsed IMPATT diode impedance measurement system according to this invention.

DESCRIPTION OF THE PREFERRED EMBODIMENT

Referring now to the single FIGURE, a pulsed IMPATT diode impedance measurement system 10 according to this invention is shown to include a conventional signal generator 11 (here operating in X-band) producing a signal amplified in a traveling wave tube (TWT) amplifier and passed, via a circulator 15, as a drive signal to an IMPATT diode oscillator 17. Such oscillator may, for example, be similar to a single one of the IMPATT diode oscillators described in U.S. Pat. No. 4,097,823, issued June 27, 1978 to George Jerinic et al and assigned to the same assignee as the present application. The third port of the circulator 15 is terminated in a load 16 that is provided to absorb the radio frequency (R.F.) power generated by the IMPATT diode oscillator 17.

A conventional pulse generator 19 provides drive pulses synchronously to the signal generator 11 and an IMPATT diode modulator such as is shown in the just-cited patent.

Desired video signals are generated by a conventional signal generator 23, amplified in an amplifier 25 and applied as input signals to a reflection test set 27 (here a Model 8502A Transmission/Reflection Test Set from Hewlett-Packard, Palo Alto, Calif. 94303. The video signal from the test port of such test set is passed, via a d.c. blocking capacitor 29, a switchable test circuit 31, and an isolation resistor 33, to the bias line (not numbered) from the IMPATT diode modulator 21 to the IMPATT diode oscillator 17. The switchable test circuit 31 here comprises a double-pole, double throw switch (not numbered) with a perturbing impedance (shown as resistor 35) and a length of transmission line (not numbered) connected as shown. The characteristic impedance of the circuitry, via the length of transmission line (not numbered) in the switchable test circuit 31 between the reflection test set and the bias line (not numbered), is here set to 50 ohms.

The reflected energy out of the reflection test set 27 is gated, via a gated amplifier 37, to a spectrum analyzer 39 (here a Model 8566A device also from Hewlett-Packard). Such analyzer is effective to filter out all input frequencies but the video excitation frequency. Consequently, harmonics of the pulse repetition frequency (PRF) do not corrupt the measurement information.

Digressing briefly here now for a moment, it should be noted that the locus of the magnitude of the reflection coefficient, $G_1$, is a circle whose radius (in polar coordinates) is defined as:

$$|G_1| = |(Z_u - Z_o)/(Z_u + Z_o)| \qquad \text{Eq. (1)}$$

where $Z_o$ is the characteristic impedance of the measurement system 10 and $Z_u$ is the unknown impedance (i.e., the video impedance of the IMPATT diode oscillator 17). The magnitude of the reflection coefficient of the IMPATT diode oscillator 17 plus the perturbing impedance, $|G_2|$, is similarly defined by:

$$|G_2| = |((Z_u + Z_p) - Z_o)/((Z_u + Z_p) + Z_o)| \qquad \text{Eq. (2)}$$

where $Z_p$ is a known perturbing impedance (which may be complex but is here the resistance of the resistor 35). Together with the known value of modulator output impedance, Equations (1) and (2) may be solved simultaneously (in a manner to be described in detail hereinbelow) to produce the values of the real and imaginary components of the video impedance of the IMPATT diode (not shown). The simultaneous solution of Equations (1) and (2) will produce two solutions for $Z_u$, only one of which is correct. The correct one of the solutions may be found by replacing the resistor 35 with an element having an impedance known to be either inductive or capacitive. Upon measurement with such an element, if the magnitude of the reflection coefficient increases over the magnitude of the reflection coefficient with resistor 35, the reactive component of the IMPATT diode oscillator 17 has the same sign as the perturbing impedance. If, however, the magnitude of the reflection coefficient of the combination then decreases, the reactive component of the IMPATT diode oscillator 17 has the opposite sign.

The signal generator 23 supplies, via the amplifier 25, continuous wave (CW) energy that passes through the reflection test set 27 to the IMPATT diode oscillator 17 and is reflected back to the reflection test set 27. It will be appreciated by those of skill in the art that the reflection coefficient then is equal to the square root of the ratio of the reflected power from the IMPATT diode oscillator 17 (in combination with the known modulator impedance) to the reflected power when the test port (not shown) of the reflection test set 27 is shorted.

As mentioned briefly hereinabove, the total phase length of the transmission media between the reflection test set 27 and the bias circuit impedance of the IMPATT diode 17 at the selected operating frequency of the signal generator 23 must be known. Likewise, the impedances of the blocking capacitor 29, the perturbing resistor 35, the isolation resistor 33 and the modulator output impedance must be known (from independent measurements of these components at the desired operating frequency) so that the impedances of these components can be removed from the measured impedance of the bias circuit of the IMPATT diode (not shown).

In operation, the signal generator 11, TWT amplifier 13 and IMPATT diode oscillator 17 are adjusted for the proper operating conditions. The switchable test circuit 31 is set to the 50 ohm through line position and the excitation frequency of the signal generator 23 is set and located on the spectrum analyzer 39. Then, a gating pulse from the pulse generator 19 to the gated amplifier 37 is set to be somewhat narrower than the pulse provided to the signal generator 11 and the IMPATT modulator 21, although the centers of both pulses are time coincident. The narrower pulse to the gated amplifier 37 gates out the rising and falling edges of the pulsed waveform produced by the IMPATT diode oscillator 17 so that the input to the spectrum analyzer 39 corresponds to the constant current portion of the input current to the diode. A reference level is set on the spectrum analyzer 39 by shorting out the test port of the reflection test set 27 with the IMPATT diode oscillator 17 "OFF". The IMPATT diode oscillator 17 is then turned "ON" and the reflected power is noted on the spectrum analyzer 39. The switchable test circuit 31 then is actuated to insert the perturbing impedance (resistor 35) in circuit and the reflected power is again measured on the spectrum analyzer 39 with the IMPATT diode oscillator "ON". The squared reflection coefficient for the perturbed and nonperturbed conditions (i.e., with and without the perturbing resistor 35 in circuit) are obtained by dividing the perturbed and nonperturbed power levels by the reference power level. These two values are used, in a manner to be described in detail hereinbelow, to calculate the sum of the impedance of the isolation resistor 33 plus the parallel combination of the impedance of the IMPATT modulator 21 and the impedance of the IMPATT diode bias circuit.

Solving Equations (1) and (2) simultaneously yields two possible solutions, $Z_A$ and $Z_B$, for the IMPATT diode bias circuit impedance (i.e., the parallel combination of the impedance of the IMPATT modulator 21 and the impedance of the IMPATT diode bias circuit) given by the following:

$$Im(Z_A) = [-M + (M^2 - 4LF)^{\frac{1}{2}}]/2L \quad \text{Eq. (3)}$$

$$Im(Z_B) = [-M - (M^2 - 4LF)^{\frac{1}{2}}]/2L \quad \text{Eq. (4)}$$

$$Re(Z_A) = (P(Im(Z_A)) + Q)/D \quad \text{Eq. (5)}$$

$$Re(Z_B) = (P(Im(Z_B)) + Q)/D \quad \text{Eq. (6)}$$

$$Z_A = Re(Z_A) + Im(Z_A) \quad \text{Eq. (7)}$$

$$Z_B = Re(Z_B) + Im(Z_B) \quad \text{Eq. (8)}$$

where:

$$D = [-2R_o(G_p^2 - 1)(G_{up}^2 + 1)]/[(G_{up}^2 - 1) + 2(G_p^2 - 1)Re(Z_n) + 2R_o(G_p^2 + 1)]$$

$$Q = -(G_p^2 - 1)(|Z_n|^2 + R_o^2 - 1) - 2R_o(G_p^2 + 1)Re(Z_n)$$

$$P = -2(G_p^2 - 1)Im(Z_n)$$

$$F = (K)(D)(Q) - Q^2 + ND^2 - K^2D^2/4$$

$$L = -P^2 - D^2$$

$$M = 2QP = (K)(D)(P)$$

$$K = -2R_o(G_{up}^2 + 1)/(G_{up}^2 + 1)$$

$$N = K^2/(4 - R_o^2)$$

$G_p$ = measured magnitude of the perturbed reflection coefficient;

$G_{up}$ = measured magnitude of the unperturbed reflection coefficient;

$Re(Z_n)$ = real part of the known impedance (i.e., the impedance of the blocking capacitor 29, the isolation resistor 33, and the perturbing resistor 35);

$Im(Z_n)$ = imaginary part of the known impedance;

$(Z_n)$ = magnitude of the known impedance; and $R_o$ = the characteristic impedance of the measurement system 10

Finally, it should be noted that the isolation resistor 33 has a nominal value of from 1 to 27 ohms and the perturbing resistor 35 has a nominal value of from 10 to 200 ohms. Impedance measurement errors will result if the proper value of the isolation resistor 33 is not used with the proper value of perturbing resistor 35. That is to say, for a given perturbing impedance value, only certain reflection coefficients (perturbed and unperturbed) will obtain for a given range of unknown impedance. If, therefore, the impedance value generated by a particular reflection coefficient pair is tested to assure that it lies on the circle which represents the unperturbed reflection coefficient, all non-physical points may be eliminated. Otherwise stated, it is possible to predict the amount of expected error in a given perturbed/unperturbed reflection coefficient region. Also, by comparing the actual reflection coefficients measured it is possible to draw conclusions as to the particular value of perturbing impedance which would provide the most accurate readings. Further, by changing the value of the measured impedance by a known quantity (i.e., adding a known resistance in series with the unknown) the measured reflection coefficients may be changed such that, for a given perturbing impedance, the regions of reflection coefficient measured may be shifted to a more accurate area.

Having described an embodiment of this invention, it will now be clear to one of skill in the art that equivalent elements may be substituted for those here shown to perform the contemplated method. It is felt, therefore, that this invention should not be restricted to its disclosed embodiment, but rather should be limited only by the spirit and scope of the appended claims.

What is claimed is:

1. The method of determining the impedance of an IMPATT diode operating as a pulsed oscillator comprising the steps of:
   (a) connecting the IMPATT diode in circuit to operate as a pulsed oscillator at a predetermined frequency and pulse repetition frequency in response to modulation signals passed over a bias line to such diode;
   (b) applying a test signal alternately through a first and a second path to the bias line, the characteristic impedance and electrical length of each such path being known a priori, with the characteristic impedance of the first path differing from the characteristic impedance of the second path; and
   (c) measuring the change in the reflectivity of the test signal between the first and the second path, such change being indicative of the impedance of the IMPATT diode operating at the predetermined frequency and pulse repetition frequency.
2. The method as in claim 1 wherein:
   (a) the characteristic impedance of the first path is 50 ohms and the characteristic impedance of the second path is greater than 50 ohms but less than 200 ohms; and
   (b) the difference between the characteristic impedances of the first and second paths is due to a nonreactive element in the second path.
3. The method as in claim 2 wherein the measurement of the reflectivity of the test signal in the first path is in accordance with:

$$|G_1| = |(Z_u - Z_o)/Z_u + Z_o)| \qquad \text{Eq. (1)}$$

and the measurement of the reflectivity of the test signal in the second path is in accordance with $$|G_2| = |(Z_u + Z_p) - Z_o)/((Z_u + Z_p) + Z_o)|. \qquad \text{Eq. (2)}$$

4. The method as in claim 3 wherein the nonreactive element in the second path is replaced by a reactive element.

* * * * *